(12) United States Patent  
Matsumoto et al.

(10) Patent No.: US 7,649,606 B2
(45) Date of Patent: Jan. 19, 2010

(54) ELECTRO-OPTICAL DEVICE AND ELECTRONIC APPARATUS

(75) Inventors: Nobuhito Matsumoto, Matsumoto (JP); Masaru Ito, Suwa (JP)

(73) Assignee: Epson Imaging Devices Corporation (JP)

( * ) Notice: Subject to any disclaimer, the term of this patent is extended or adjusted under 35 U.S.C. 154(b) by 264 days.

(21) Appl. No.: 11/634,196

(22) Filed: Dec. 6, 2006

(65) Prior Publication Data

US 2007/0138613 A1  Jun. 21, 2007

(30) Foreign Application Priority Data

Dec. 6, 2005  (JP) .............................. 2005-351626

(51) Int. Cl.
*G02F 1/1345* (2006.01)
(52) U.S. Cl. ...................... 349/149; 349/152
(58) Field of Classification Search ......... 349/149–152, 349/192; 345/90, 80, 87; 257/678

See application file for complete search history.

(56) References Cited

U.S. PATENT DOCUMENTS

| 6,262,702 | B1 * | 7/2001 | Murade ...................... 345/87 |
| 6,697,040 | B2 * | 2/2004 | Imajo et al. .................. 345/98 |
| 6,809,390 | B2 * | 10/2004 | Toda et al. .................. 257/434 |
| 2002/0191140 | A1 * | 12/2002 | Eguchi et al. ............... 349/149 |

FOREIGN PATENT DOCUMENTS

| JP | 09-260091 | 9/1997 |
| JP | 11-268530 | 9/1999 |

* cited by examiner

*Primary Examiner*—Thoi V Duong
(74) *Attorney, Agent, or Firm*—Lowe Hauptman Ham & Berner, LLP

(57) ABSTRACT

An electro-optical device includes a substrate, a plurality of external connection terminals provided on the substrate, an electronic component mounted on the substrate and having a plurality of terminals, and a plurality of wires that electrically connect the plurality of external connection terminals to the plurality of terminals of the electronic component. A constant-potential wire is provided in the vicinity of locations of connections of at least some of the plurality of wires with the respective terminals of the electronic component.

13 Claims, 6 Drawing Sheets

ELECTRO-OPTICAL DEVICE AND ELECTRONIC APPARATUS

RELATED APPLICATION

The present application is based on, and claims priority from, Japanese Application Serial Number 2005-351626, filed Dec. 6, 2005, the disclosure of which is hereby incorporated by reference herein in its entirety.

The entire disclosure of Japanese Patent Application No. 2005-351626, filed Dec. 06, 2005 is expressly incorporated by reference herein.

BACKGROUND

1. Technical Field

The present invention relates to an electro-optical device and an electronic apparatus, and, more particularly, to an electro-optical device having excellent electrostatic resistance.

2. Related Art

In, for example, the field of electro-optical device, such as an active matrix liquid crystal display device, breakage of a thin film transistor (hereafter referred to as "TFT) may occur due to static electricity with which a substrate is charged during manufacturing. To prevent such an element breakage, the following technology has been proposed (refer to, for example, JP-A-11-95257). In this technology, short-circuit wires that electrically connect scanning lines and data lines to each other are formed on a substrate, and static electricity is spread towards the outer periphery of the substrate through the short-circuit wires to prevent sudden excess electrical current from flowing to the TFT.

In a liquid crystal display device, what is called a chip-on-glass (COG) mounting structure for mounting a driving integrated circuit (IC) directly onto a substrate is known. In recent years, there is a demand for size reduction of a liquid crystal display device including a driving circuit as a result of a reduction in size of an electronic apparatus, such as a cellular phone. Therefore, the COG mounting structure is considerably used. In a liquid crystal display device using such a COG mounting structure, an electricity removing pattern is formed at an end of an electrode or a wire pattern for protecting the electrode or the wire from static electricity (refer to, for example, JP-A-2001-92371).

However, a liquid crystal display device including the COG mounting structure is such that an external substrate, such as a flexible printed circuit (hereafter referred to as "FPC"), for supplying a power supply voltage or an image signal to the driving IC mounted on the substrate is connected between the liquid crystal display device and an electronic apparatus. This causes static electricity to enter the liquid crystal display device through the FPC, which may cause the following problems to occur at external connection terminals.

FIG. 10 is a plan view of a related liquid crystal display device. A plurality of external connection terminals 101 are provided at a peripheral end of a substrate 100. An FPC (not shown) is connected to the external connection terminals 101 at one end (upper end in FIG. 10). A wire 104 for connection to its associated terminal of a driving IC 102 is provided at the other end of each external connection terminal 101. A pad 103 is provided at an end of each wire 104. Usually, before shipment of a product, electrostatic resistance is measured, and a high voltage of a few kV corresponding to static electricity is forcefully applied to each external connection terminal 101 to inspect its breakage state. The inventors of the application made inspections and found out that, in the liquid crystal display device having the structure shown in FIG. 10, as the voltage is increased, breakage (wire breakage) occurs at ends of the wires 104 disposed closer to the driving IC 102. The inventors found out that, in particular, the breakage (wire breakage) tends to occur in bent portions (corresponding to portions surrounded by a dashed ellipse K in FIG. 10) of the wires 104 connected to the respective external connection terminals that are represented by reference numerals 101a to 101d. In other words, a margin with respect to a standard of electrostatic resistance inspection is small, in particular, at the external connection terminals 101a to 101d, giving rise to a problem in reliability.

Although JP-A-11-95257 and JP-A-2001-92371 disclose structures that protect, for example, devices, electrodes, and wires from static electricity, electrostatic breakage around the external connection terminals cannot be prevented from occurring. In addition, although, in the foregoing description, liquid crystal display devices are taken as examples, the aforementioned problems are not limited to liquid crystal display devices. That is, they are problems that are common to electro-optical devices having the aforementioned COG mounting structure.

SUMMARY

An advantage of the invention is that it provides an electro-optical device having excellent electrostatic resistance at external connection terminals.

To this end, according to a first aspect of the invention, there is provided an electro-optical device including a substrate, a plurality of external connection terminals provided on the substrate, an electronic component mounted on the substrate and having a plurality of terminals, and a plurality of wires that electrically connect the plurality of external connection terminals to the plurality of terminals of the electronic component. A constant-potential wire is provided in the vicinity of locations of connections of at least some of the plurality of wires with the respective terminals of the electronic component. A few V to a few tens of V, used in an ordinary electro-optical device, is supplied to the constant-potential wire.

Here, the term "electro-optical device" in the invention is a general term used to refer to, for example, an electro-optical device which converts electrical energy into optical energy, in addition to an electro-optical device having an electro-optical effect that changes light transmittance ratio as a result of changing the refractive index of a material by an electrical field. Therefore, the term is a concept including a light-emitting device as typified by, for example, an organic electroluminescence (EL) device, an inorganic EL device, and a liquid crystal device.

In the electro-optical device according to the first aspect of the invention, a constant-potential wire is provided in the vicinity of the locations of connections of the at least some wires among the plurality of wires, which electrically connect the external connection terminals to the terminals of the electronic component, with the respective terminals of the electronic component. Therefore, when static electricity enters the external connection terminals and spreads to the vicinity of the connection locations, an electric discharge occurs due to a potential difference between the wires and the constant-potential wire. At this time, even if a part of an area in the vicinity of the wires and the constant-potential wire breaks, it is possible to prevent the wires from breaking completely. Therefore, it is possible to achieve an electro-optical device which has excellent electrostatic resistance, in particular, at the external connection terminals.

It is desirable that the constant-potential wire be provided at a predetermined interval from extending portions that are disposed at locations beyond the connection locations of the at least some wires extending from the external connection terminals to the locations beyond the connection locations.

According to this structure, when static electricity enters the external connection terminals and spreads to the extending portions, an electric discharge occurs between the extending portions and the constant-potential wire. Here, an area in the vicinity of the wire extending portions and the constant-voltage wire may break. However, since electric charge can escape as a result of intentionally causing an electrical discharge to occur at the extending portions not used for electrical connection with, for example, an external substrate, an area extending to the connection locations from the external connection terminals used for electrical connection is not broken. Therefore, it is possible to provide an electro-optical device which has excellent electrostatic resistance at the external connection terminals.

It is desirable that the "predetermined interval" between the extending portions and the constant-potential wire be on the order of, for example, from 15 μm to 50 μm. This is because, if it is less than 15 μm, photolithography that is performed in manufacturing the electro-optical device becomes burdensome to carry out, whereas, if it is greater than 50 μm, electric discharge does not easily occur, thereby causing electrostatic resistance to start to decrease.

In the above-described structure in which the wires have the extending portions, it is desirable that the widths of the wires at the connection locations be greater than the widths of the terminals of the electronic component.

If the wire widths are the same as the terminal widths of the electronic component, when the electronic component is mounted, electrical charge is subjected to a resistance at the connection locations, thereby making it difficult for the electrical charge to spread to the extending portions near the constant-potential wire, as a result of which electrical discharge does not easily occur. Therefore, if the wire widths are larger than the terminal widths of the electronic component, the resistance at the connection locations is reduced, so that the electrical charge sufficiently spreads to the extending portions. Consequently, it is possible to stably ensure a protection effect with respect to static electricity.

It is desirable that at least the constant-potential wire or wire/each wire be provided with a protrusion that protrudes towards the wire/each wire or the constant-potential wire, the wire/each wire and the constant-potential wire opposing each other at the predetermined interval from each other.

According to this structure, since the static electricity concentrates more at the protrusions as compared to the case in which portions of the wires and the constant-potential wire that oppose each other are flat, an electrical discharge tends to occur due to what is called a lightning-rod-like effect. Therefore, in this structure according to this form of the invention, it is possible to increase a protection effect with respect to the static electricity.

It is desirable that the constant-potential wire be integrally provided with the wire among the plurality of wires that supplies a constant potential from the associated external connection terminal to the electronic component.

Ordinarily, the constant-potential wire has an electrical potential on the order of an electrical potential used in the electro-optical device. If the electrical potential is that causing a large potential difference to occur between this electrical potential and an electrical potential of a few kV, the voltage is not particularly limited. However, ordinarily, an external connection terminal that is connected to a constant-potential input terminal of the electronic component always exists among the external connection terminals. Therefore, it is desirable to extend the wire connected to this external connection terminal and integrally form this as the constant-potential wire. If this is done, it is not necessary to separately provide a constant-potential wire and purposely supply a constant potential to the constant-potential wire. Therefore, the designing and disposition of a wire pattern are not complicated, so that the electro-optical device can be suitable for size reduction.

Although, as mentioned above, the electrical potential that is supplied to the constant-potential wire is not particularly limited, it is desirable that a ground potential be supplied to the constant-potential wire.

According to this structure, since the electrical potential of the constant-potential wire is most stable, the protection effect with respect to static electricity is more stably exhibited.

It is desirable that the wires be tapered so as to become narrower from the external connection terminals towards the connection locations.

The inventors found out that, for the related external connection terminals having bent portions, electrical charge accumulates at the bent portions and an electrical discharge tends to occur at the bent portions, causing them to break. In this form of the invention, as mentioned above, an electrical discharge is caused to occur between the constant-potential wire and the wires to make it possible to increase electrostatic resistance. In addition, when a tapering form that becomes narrower is used instead of the related wire form having the bent portions, the electrical charge does not accumulate at the bent portions, so that it is possible to more reliably protect the area extending from the external connection terminals to the connection locations.

According to a second aspect of the invention, there is provided an electronic apparatus including the above-described electro-optical device.

According to this structure, it is possible to provide an electronic apparatus including a display unit formed by an electro-optical device having excellent reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

An embodiment of the invention will hereunder be described with reference to FIGS. 1 to 8.

Figure 1:
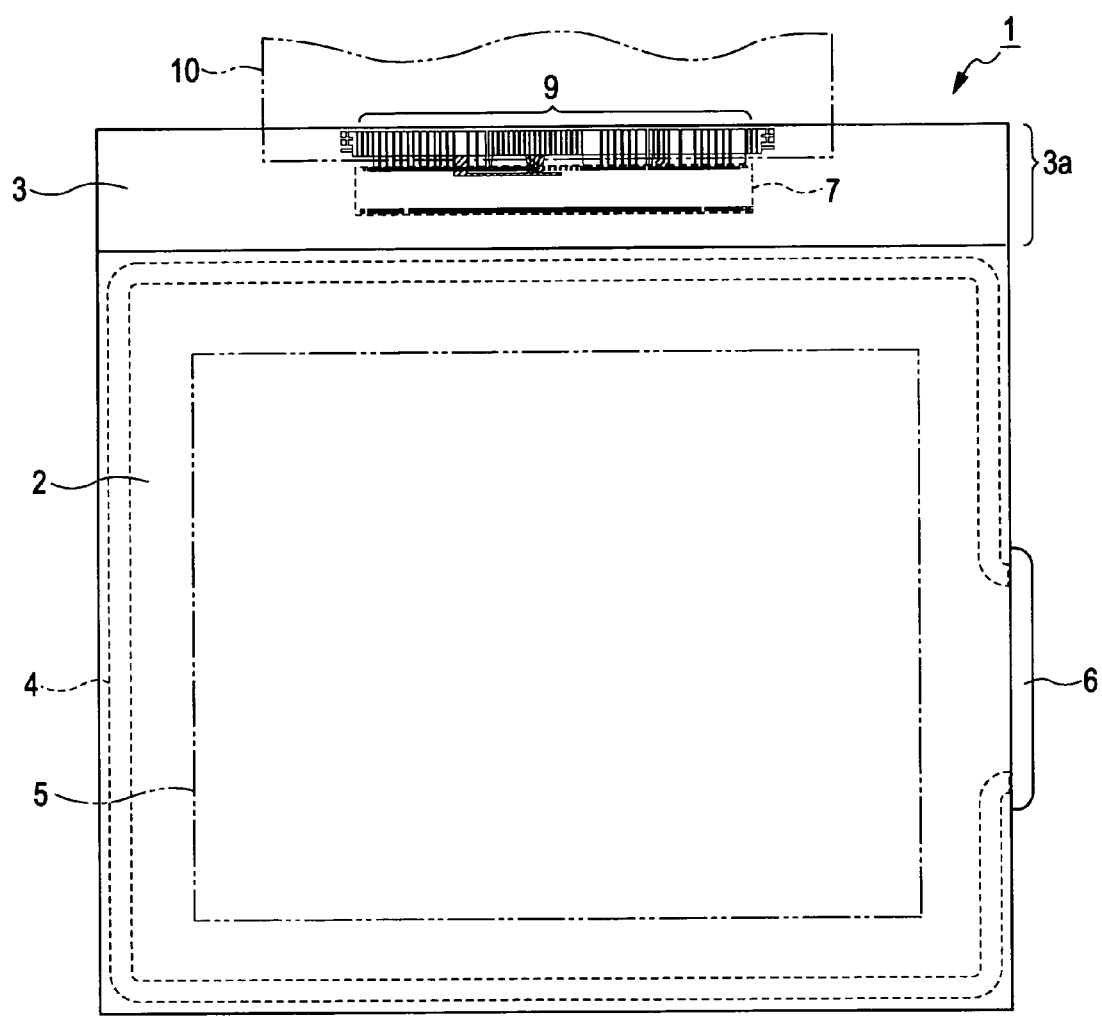
FIG. 1 is a plan view of a liquid crystal display device (electro-optical device) according to an embodiment of the invention.
Figure 2:
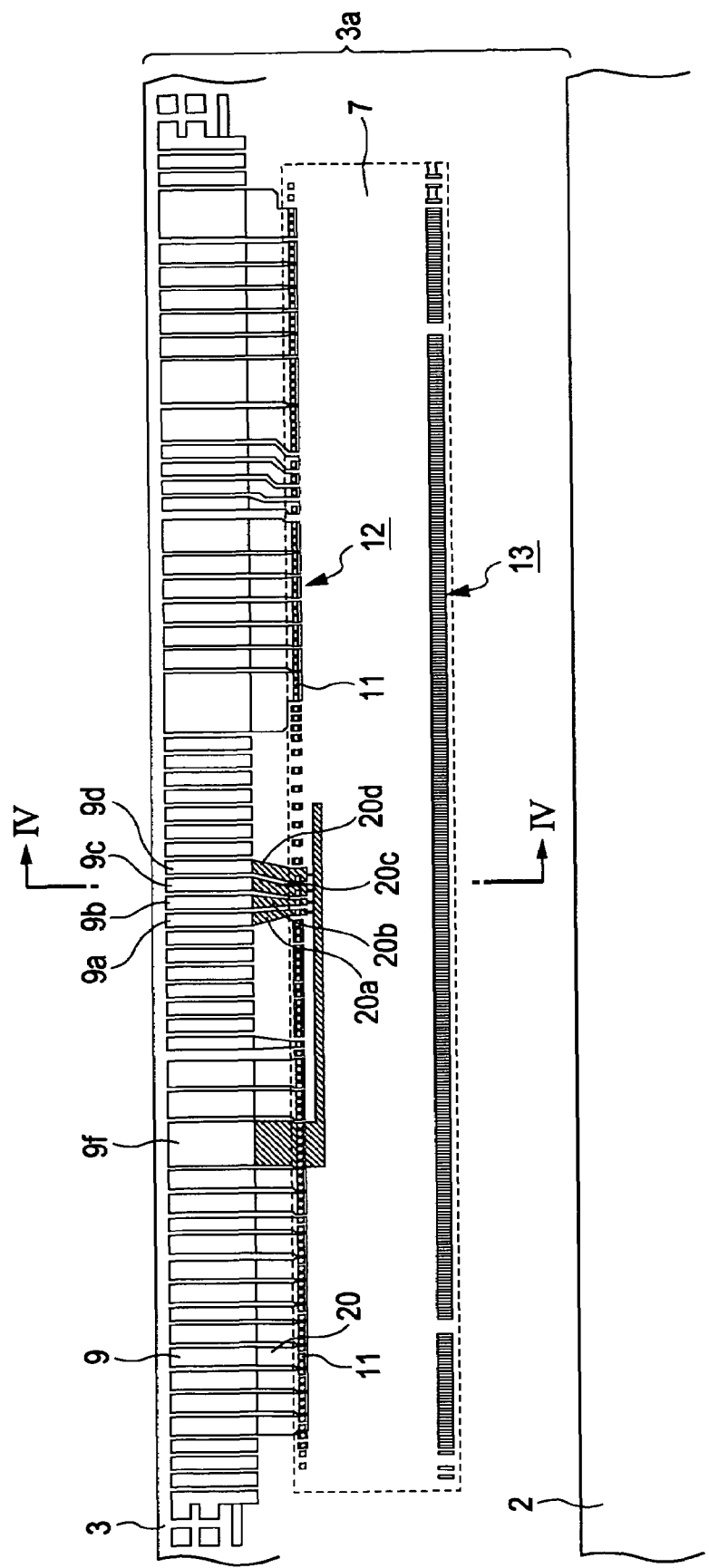
FIG. 2 is an enlarged plan view of a mounting portion of a driving IC of the liquid crystal display device.
Figure 3:
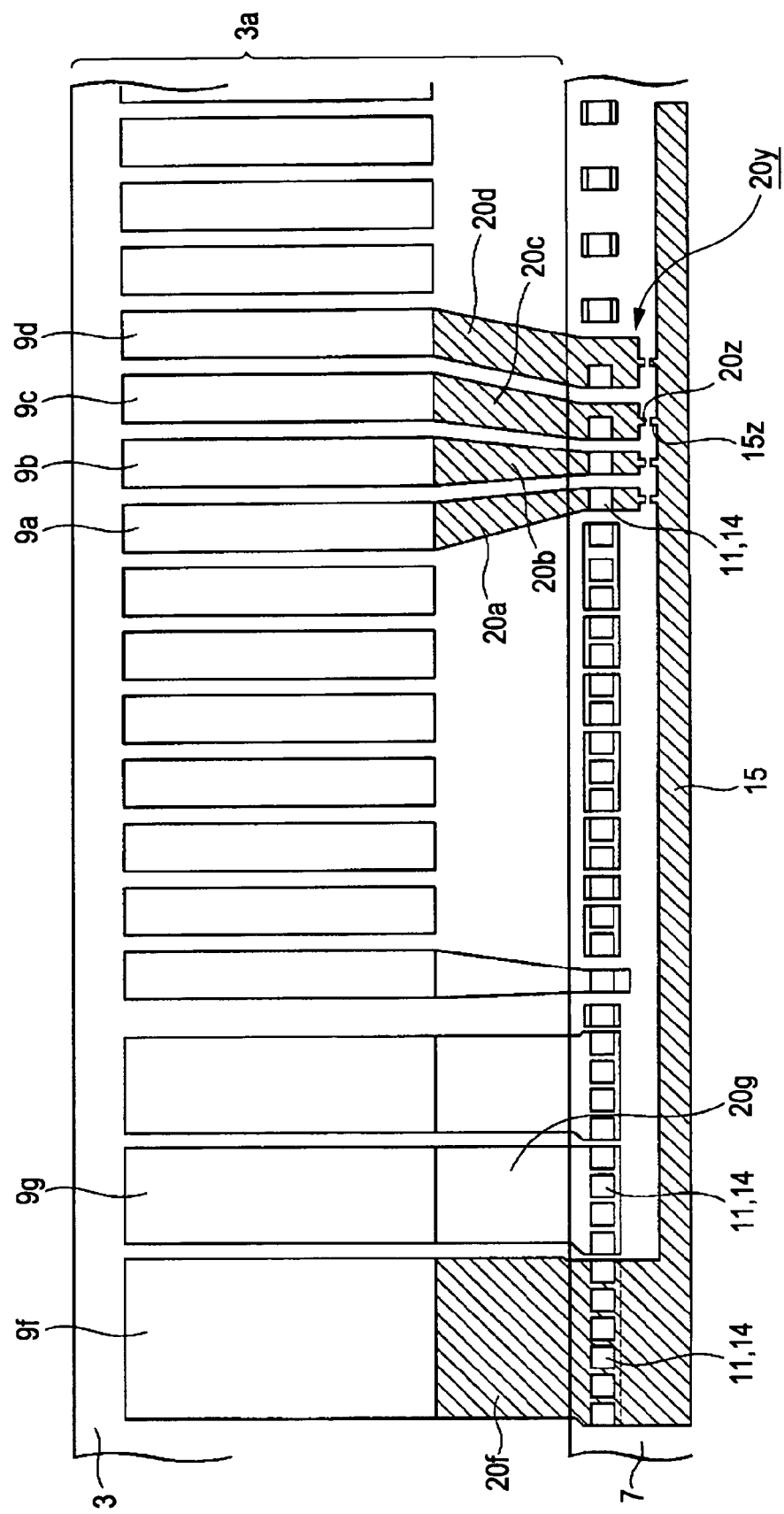
FIG. 3 is an enlarged plan view of external connection terminals of the liquid crystal display device.
Figure 4:
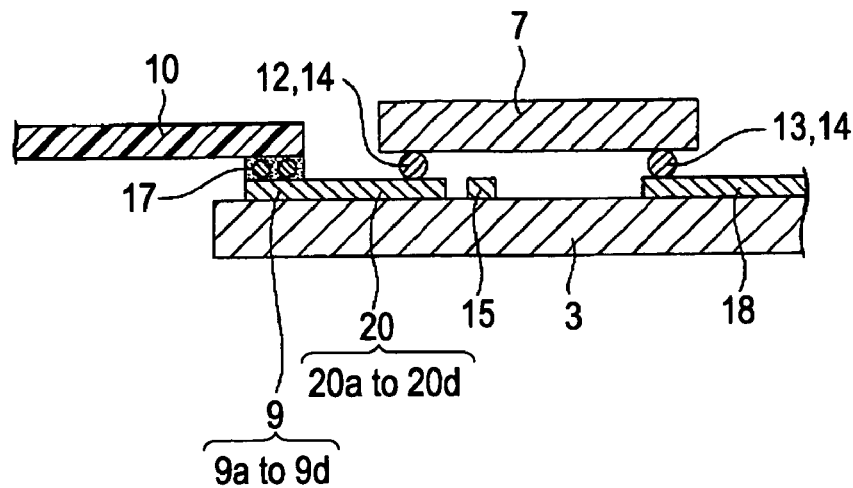
FIG. 4 is a sectional view taken along line IV-IV of FIG. 2.

FIG. 1 is a plan view of a liquid crystal display device (electro-optical device) according to an embodiment of the invention. FIG. 2 is an enlarged plan view of a mounting portion of a driving IC (electronic component). FIG. 3 is an enlarged plan view of external connection terminals. FIG. 4 is a sectional view taken along line IV-IV of FIG. 2.

In each of the figures below, to make it easier to see each structural element in the figures, the scale is changed if necessary.

As shown in FIG. 1, in a liquid crystal display device 1 according to the embodiment, a first substrate 2 and a second substrate 3 are separated from each other by a predetermined interval and adhered to each other through a sealant 4. A space formed by the pair of substrates 2 and 3 and the sealant 4 is filled with liquid crystals. An area surrounded by alternate long and two short dash lines and represented by reference numeral 5 is an effective display area. Reference numeral 6 denotes a sealing member that seals an opening (liquid crystal injection opening) of the sealant 4. In the embodiment, the first substrate 2 and the second substrate 3 are both rectangular, the second substrate 3 is larger than the first substrate 2, three sides of the substrates 2 and 3 overlap each other, and one side (upper side in FIG. 1) of the second substrate 3 protrudes outward from the first substrate 2. A liquid crystal display device having what is called a COG mounting structure in which a driving IC 7 is mounted to the protruding area of the second substrate 3 is constructed.

As shown in FIGS. 1 and 2, a plurality of external connection terminals 9 (9a, 9b, etc.) are formed at a substrate peripheral end of a protruding area 3a of the second substrate 3. An FPC 10 for supplying a power supply potential or an image signal to the driving IC 7 is connected to the external connection terminals 9 at one end (upper end in FIGS. 1 and 2). Wires 20 (20a, 20b, etc.) for connection with input terminals of the driving IC 7 are provided at the other ends (lower ends in FIGS. 1 and 2) of the external connection terminals 9, and pads 11 are provided at end portions of the wires 20. As shown in FIG. 2, the driving IC 7 in the embodiment has an elongated rectangular shape. A plurality of input terminals 12 are formed along a long side at a substrate peripheral end side (upper side in FIG. 2) of the driving IC 7, and a plurality of output terminals 12 are formed along a long side of a substrate central side (lower side in FIG. 2) of the driving IC 7.

As shown in FIG. 3, the external connection terminals 9 each have a rectangular shape, but their widths are not all the same, that is, their widths differ depending upon the terminal type. In addition, the shapes of the wires that are connected to the external connection terminals 9 also differ depending upon the terminal type. For example, in FIG. 3, the leftmost external connection terminal 9f and wire 20f supply a common electrical potential to six adjacent terminals 14 of the driving IC 7, while the second external connection terminal 9g and wire 20g from the left supply a common electrical potential to four adjacent terminals 14 of the driving IC 7. In particular, the leftmost external connection terminal 9f and wire 20f have a ground potential supplied thereto. The shapes of the wires 20f and 20g, connected to the terminals 14, of the respective external connection terminals 9f and 9g are rectangular having a substantially constant width. The four central external connection terminals 9a, 9b, 9c, and 9d are each connected to one terminal 14 to supply, for example, an image signal thereto. In the wires 20a to 20d connected to the respective external connection terminals 9a to 9d, due to a difference between a terminal pitch at the side of the external connection terminals 9a to 9d (FPC 10 side) and a terminal pitch at the side of the driving IC 7, ends (upper sides in FIG. 3) connected to the respective external connection terminals 9a to 9d have large widths, while the other ends (lower sides in FIG. 3) connected to the driving IC 7 have tapering forms whose widths become smaller.

As shown in FIG. 3, the wires 20a to 20d of the four central external connection terminals 9a to 9d extend from the external connection terminals 9a to 9d, go beyond the connection locations where the wires 20a to 20d are connected to the terminals 14 of the driving IC 7 (the locations of the pads 11), and reach the side opposite to the external connection terminals 9a to 9d (substrate central side). The wire 20f of the left-end external connection terminal 9f to which ground potential is supplied extends from the external connection terminal 9f, go beyond the location where it is connected to the terminal 14 of the driving IC 7 (the location of the pad 11), reaches the side opposite to the external connection terminal 9f (substrate central side), is bent by an angle of 90 degrees, and extends to the wires 20a to 20d of the four external connection terminals 9a to 9d. Here, of the portions of the left-end wire 20f, the portion that is bent by 90 degrees and extends towards the four external connection terminals 9a to 9d is called a constant-potential wire 15. The constant-potential wire 15 and extending portions 20y extending beyond the connection locations of the four wires 20a to 20d are disposed close to each other. Further, in the embodiment, rectangular protrusions 20z of the extending portions 20y of the wires 20a to 20d and rectangular protrusions 15z of the constant-potential wire 15 are provided. The protrusions 20z and 15z protrude toward each other. The interval between the protrusions 20z and the protrusions 15z is on the order of from 15 μm to 50 μm.

As shown in FIG. 4, the FPC 10 and the external connection terminals 9a to 9d are electrically connected to each other by an anisotropic conductive film 17 at one end. In addition, the input terminals (bumps 14) of the driving IC 7 are electrically connected to the wires 20a to 20d at the other end. The output terminals 13 (bumps 14) of the driving IC 7 are connected to wires 18 (not shown in FIGS. 1 and 2 because their widths are extremely small) that are connected to electrodes in the effective display area 5. The constant-potential wire 15 is positioned below the driving IC 7.

In the liquid display device 1 according to the embodiment, patterns of the wires 20a to 20d, connected to the four external connection terminals 9a to 9d among the plurality of external connection terminals 9, extend beyond the connection locations where they are connected to the terminals 14 of the driving IC 7 and reach the substrate central side, to form the extending portions 20y, so that the constant-potential wire 15 is provided at the predetermined interval from the extending portions 20y. Therefore, if static electricity enters these external connection terminals 9a to 9d, the static electricity is spread to the extending portions 20y, so that an electrical discharge occurs between the constant-potential wire 15 having an electrical potential of 0 V and the extending portions 20y having an electrical potential of a few kV. Here, depending upon the magnitude of the static electricity, an area in the vicinity of the extending portions 20y and the constant-potential wire 15 may break. However, by deliberately causing breakage to occur at the extending portions 20y that are not used for electrical connection with the FPC 10, an area extending from the locations of connection with the FPC 10 to the connection locations where the wires are connected to the terminals 14 of the driving IC 7 can be protected from electrostatic breakage. This makes it possible to achieve a liquid crystal display device having excellent electrostatic resistance, in particular, at the external connection terminals.

In particular, in the embodiment, since the protrusions 20z and 15z protruding towards each other are provided at the wires 20a to 20d and the opposing constant-potential wire 15, static electricity concentrates more at the protrusions 20z and 15z as compared to the case in which portions of the wires 20a to 20d and the constant-potential wire 15 that oppose each other are flat. Therefore, an electrical discharge tends to occur due to what is called a lightning-rod-like effect. Therefore, it is possible to increase a protection effect with respect to the static electricity.

In the embodiment, since the constant-potential wire 15 is integrally formed by routing it from the pattern of the wire 20f of the external connection terminal 9f for supplying a ground potential thereto, it is not necessary to provide a structure in which a constant-potential wire is separately provided and a constant potential is supplied thereto. Therefore, the designing and disposition of the pattern are not complicated, so that the designing of the pattern at the protruding area 3a is facilitated, so that the electro-optical device can be suitable for size reduction.

Further, in the embodiment, since the patterns of the wires 20a to 20d taper so as to become narrower from the external connection terminals 9a to 9d towards the connection locations where the wires 20a to 20d are connected to the terminals 14 of the driving IC 7, electrical charge does not accumulate at the bent portions as they do in the related external connection terminals having bent portions. Therefore, the area extending from the external connection terminals 9a to 9d to the connection locations where the wires are connected to the terminals 14 can be more reliably protected.

As shown in FIG. 3, the wires 20c and 20d, connected to the two right external connection terminals 9c and 9d among the four external connection terminals 9a to 9d to which measures are taken to increase their electrostatic resistance, have widths that are larger than those of the terminals 14 (pads 11) of the driving IC 7, at the connection locations where the wires are connected to the terminals 14. In addition, as shown in FIG. 3, the widths of the two left wires 20a and 20b cannot be made larger than the widths of the terminals 14 due to a terminal-pitch-related reason. However, by setting the pattern widths of the wires 20c and 20d larger at the connection locations in this way, the static electricity tends to flow towards the protrusions 20z by avoiding the terminals 14. Therefore, electrical discharge tends to occur, so that a protection effect with respect to the static electricity can be stably provided.

Figure 5:
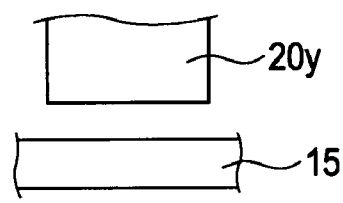
FIG. 5 is a plan view of a modification of a form of a constant-potential wire and a form of a wire of each external connection terminal.
Figure 6:
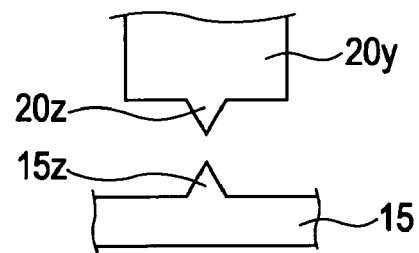
FIG. 6 is a plan view of another modification.
Figure 7:
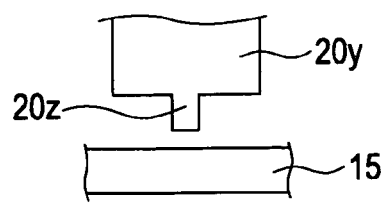
FIG. 7 is a plan view of still another modification.
Figure 8:
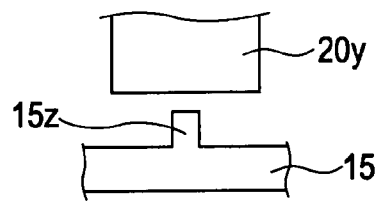
FIG. 8 is a plan view of still another modification.

The technical scope of the invention is not limited to the above-described embodiment, so that various modifications may be made within a range not departing from the gist of the invention. The constant-potential wire 15 and the extending portions 20y of the wires 20a to 20d may have any one of the following forms. For example, as shown in FIG. 5, the constant-potential wire 15 and the extending portions 20y of the wires 20a to 20d do not have protrusions; as shown in FIG. 6, the protrusions 20z of the extending portions 20y of the wires 20a to 20d and the protrusions 15z of the constant-potential wire 15 are triangular; as shown in FIG. 7, only the extending portions 20y of the wires 20a to 20d are provided with the protrusions 20z; or, as shown in FIG. 8, only the constant-potential wire 15 is provided with the protrusions 15z. In all of these cases, it is desirable that the closest portions of the extending portions 20y and the constant-potential wire 15 be separated by the interval in the range of from 15 μm to 50 μm. The protrusions 20z and 15z may be semicircular, in addition to being square-shaped or triangular. Further, in the above-described embodiment, a ground potential is supplied to the constant-ground wire 15. Here, it is possible to cause a sufficient electrical discharge to occur even with a structure that supplies a power supply potential of, for example, from a few V to a few tens of V. The disposition of the constant-potential wire in the above-described embodiment is considered to be the best disposition, but it is not limited thereto. Accordingly, as long as it is disposed close to the locations where the wires 20a to 20d are connected to the terminals 14, similar advantages can be provided. The electronic component mounted to the substrate is not limited to the driving IC.

Electronic Apparatus

An embodiment of an electronic apparatus according to the invention will be described.

Figure 9:
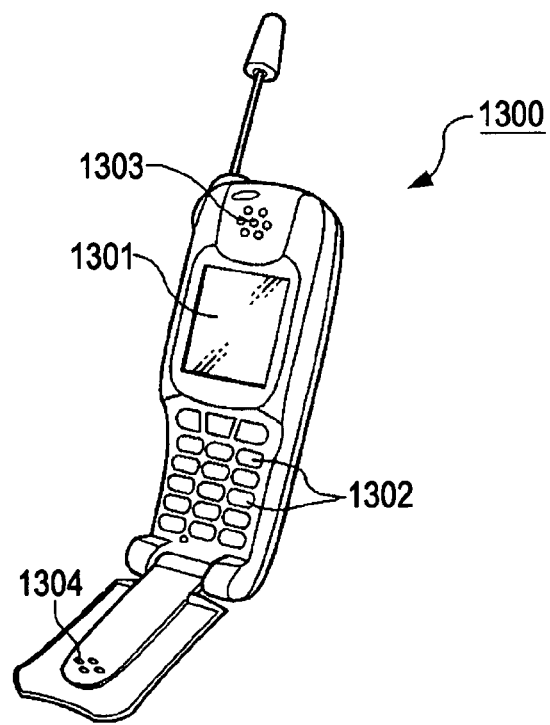
FIG. 9 is a perspective view of an electronic apparatus according to an embodiment of the invention.
Figure 10:
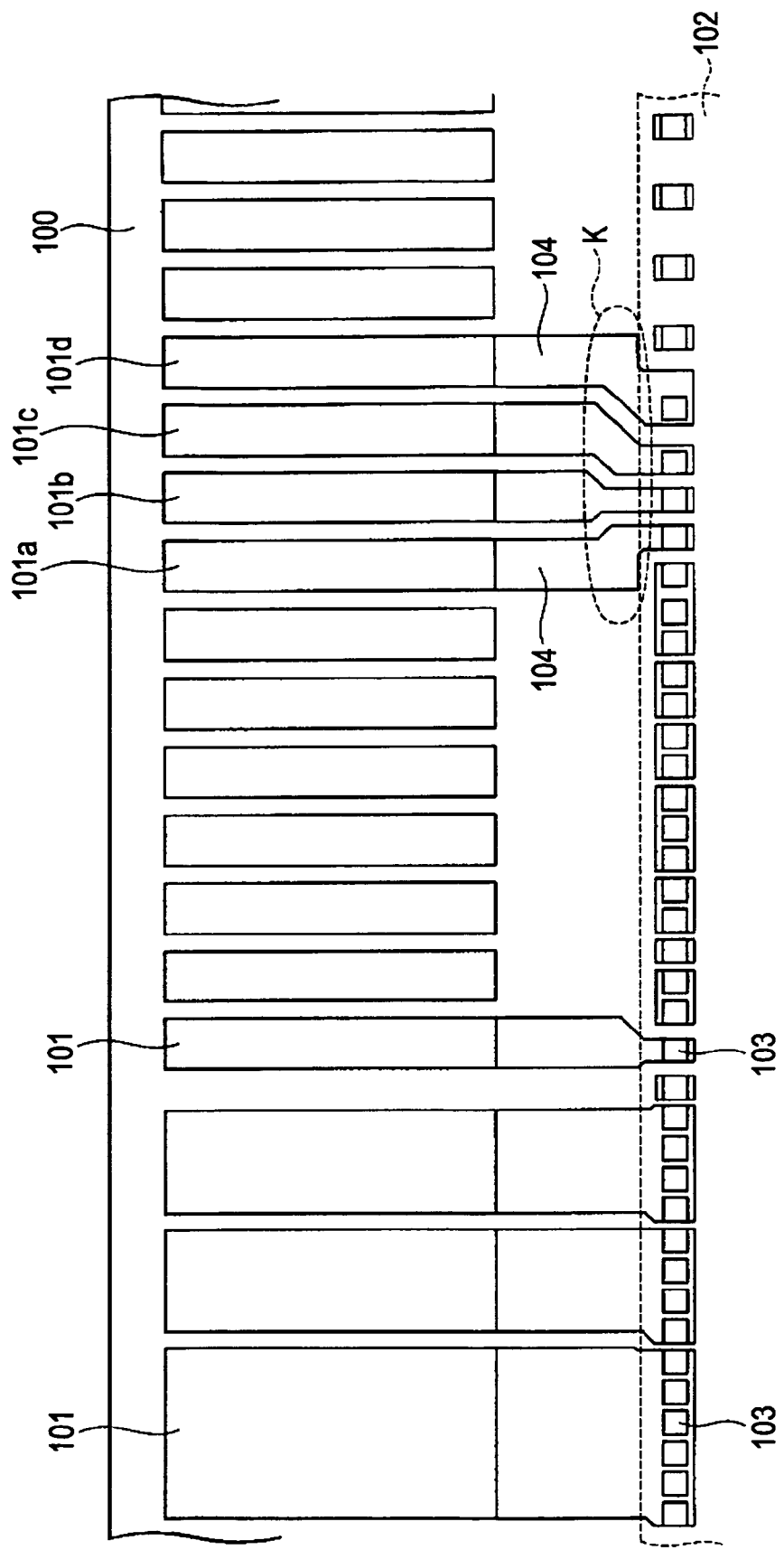
FIG. 10 is a plan view of external connection terminals of a related liquid crystal display device.

FIG. 9 is a perspective view of a cellular phone, which is an example of the electronic apparatus according to the invention. A cellular phone 1300 includes the liquid crystal display device according to the above-described embodiment as a display unit 1301, a plurality of operation buttons 1302, an earpiece 1303, and a mouthpiece 1304. Since the electronic apparatus includes the liquid crystal display device according to the above-described embodiment, it includes a highly reliable display unit.

The application of the liquid crystal display device according to the above-described embodiment is not limited to the cellular phone. It may be suitably used as an image displaying device of, for example, an electronic book, a personal computer, a digital still camera, a liquid crystal TV, a view-finder-type or monitor direct-viewing-type video tape recorder, a car navigator, a pager, an electronic notebook, an electric calculator, a word processor, a work station, a TV telephone, a POS terminal, or an apparatus including a touch panel. All of these electronic apparatuses include a highly reliable display unit.

What is claimed is:

1. An electro-optical device, comprising:
   a substrate;
   a plurality of external connection terminals provided on the substrate;
   an electronic component mounted on the substrate and having a plurality of terminals;
   a plurality of wires that electrically connect the plurality of external connection terminals to the plurality of terminals of the electronic component, respectively; and
   a constant-potential wire provided in the vicinity of the terminals of the electronic component, and on an opposite side of the terminals of the electronic component with respect to the external connection terminals.

2. The electro-optical device according to claim 1, wherein
   the wires extend from the external connection terminals to the respective terminals of the electronic component, and further project beyond the terminals of the electronic component toward the constant-potential wire; and
   the constant-potential wire is provided at a predetermined interval from projecting portions of said wires.

3. The electro-optical device according to claim 2, wherein widths of the wires at connection locations where the wires are connected with the respective terminals of the electronic component are larger than widths of the respective terminals of the electronic component.

4. The electro-optical device according to claim 1, wherein the constant-potential wire is integrally provided with the wire among the plurality of wires that is adapted to supply a constant potential from the associated external connection terminal to the electronic component.

5. The electro-optical device according to claim 1, wherein the constant-potential wire is grounded.

6. The electro-optical device according to claim 1, wherein the wires are tapered so as to become narrower from the external connection terminals towards the respective terminals of the electronic component.

7. An electronic apparatus, comprising: the electro-optical device of claim 1.

8. The electro-optical device according to claim 1, wherein the constant-potential wire is connected to the external connection terminal of a ground potential among the plurality of external connection terminals.

9. The electro-optical device according to claim 1, wherein the constant-potential wire is located under the electronic component.

10. The electro-optical device according to claim 1, wherein the constant-potential wire or at least one of the wires opposing the constant-potential wire is provided with a protrusion that protrudes towards the wire opposing the constant-potential wire or the constant-potential wire, respectively.

11. The electro-optical device according to claim 1, wherein
wherein more than two of the wires include extension portions that extend beyond connection locations, where said more than two wires are electrically connected to the respective terminals of the electronic component, away from the respective external connection terminals and toward the constant-potential wire, thereby forcing any electrostatic discharge between said more than two wires and the constant-potential wire to occur in the extension portions rather than in the respective connection locations.

12. The electro-optical device according to claim 1, wherein
the terminals of the electronic component connected to said wires are arranged in a row, and a lengthwise direction of the constant-potential wire extends along said row.

13. An electro-optical device comprising:
a substrate;
a plurality of external connection terminals provided on the substrate;
an electronic component mounted on the substrate and having a plurality of terminals; and
a plurality of wires that electrically connect the plurality of external connection terminals to the plurality of terminals of the electronic component;
wherein a constant-potential wire is provided in the vicinity of locations of connections of at least some of the plurality of wires with the respective terminals of the electronic component; and
wherein at least the constant-potential wire or wire opposing the constant-potential wire is provided with a protrusion that protrudes towards the wire opposing the constant-potential wire or the constant-potential wire.

* * * * *